US012635427B2

(12) United States Patent
Wada

(10) Patent No.: US 12,635,427 B2
(45) Date of Patent: May 19, 2026

(54) FLAT EPITAXIAL WAFER HAVING MINIMAL THICKNESS VARIATION

(71) Applicant: SUMCO CORPORATION, Tokyo (JP)

(72) Inventor: Naoyuki Wada, Arita-cho (JP)

(73) Assignee: SUMCO CORPORATION, Tokyo (JP)

( * ) Notice: Subject to any disclaimer, the term of this patent is extended or adjusted under 35 U.S.C. 154(b) by 565 days.

(21) Appl. No.: 18/103,886

(22) Filed: Jan. 31, 2023

(65) Prior Publication Data

US 2023/0326752 A1 Oct. 12, 2023

Related U.S. Application Data

(60) Provisional application No. 63/329,199, filed on Apr. 8, 2022.

(51) Int. Cl.
*C30B 25/20* (2006.01)
*C30B 29/06* (2006.01)
(Continued)

(52) U.S. Cl.
CPC .............. *H10P 14/24* (2026.01); *C30B 25/20* (2013.01); *C30B 29/06* (2013.01); *H10D 62/117* (2025.01);
(Continued)

(58) Field of Classification Search
CPC ... C30B 25/20; C30B 29/06; H01L 21/02381; H01L 21/0262; H01L 21/02433;
(Continued)

(56) References Cited

U.S. PATENT DOCUMENTS 5,904,136 A 5/1999 Nagatsuka et al.
8,152,919 B2 4/2012 Dohi et al.
(Continued)

FOREIGN PATENT DOCUMENTS

JP S61-161708 A 7/1986
JP H01-82518 A 6/1989
(Continued)

OTHER PUBLICATIONS

Notification to Grant issued in JP Patent Application No. 2023-031821, Mar. 4, 2025, translation.
(Continued)

*Primary Examiner* — Robert M Kunemund
(74) *Attorney, Agent, or Firm* — GREENBLUM & BERNSTEIN, P.L.C.

(57) ABSTRACT

An epitaxial wafer includes a silicon substrate having a top surface and an epitaxial layer on said top surface, wherein the epitaxial layer has a thickness in a range of 0.3 μm to 1.0 μm, and a thickness variation of 1% or less. A method of preparing such epitaxial wafer includes placing a silicon substrate on a susceptor in an epitaxial reactor; rotating the susceptor at a rotation rate (D); and applying a source gas in the epitaxial reactor to grow an epitaxial layer of a desired thickness (B) at a growth rate (A) on the silicon substrate; wherein the source gas is applied for a growth time (C) that satisfies C=B/A and the rotation rate (D) is selected from a range of 22 to 70 rpm that allows the susceptor to rotate to an exact integer number of turns (E) based on a relationship D=E/C.

28 Claims, 6 Drawing Sheets

(51) Int. Cl.

| | | |
|---|---|---|
| *H10D 62/10* | (2025.01) | |
| *H10D 62/40* | (2025.01) | |
| *H10P 14/20* | (2026.01) | |
| *H10P 14/24* | (2026.01) | |

(52) U.S. Cl.
  CPC ....... *H10D 62/405* (2025.01); *H10P 14/2905* (2026.01); *H10P 14/2926* (2026.01); *H10P 14/3411* (2026.01); *H10P 14/3444* (2026.01)

(58) Field of Classification Search
  CPC ........ H01L 21/02532; H01L 21/02579; H01D 62/405; H01D 62/117
  See application file for complete search history.

(56) References Cited

U.S. PATENT DOCUMENTS

| | | | |
|---|---|---|---|
| 9,076,750 | B2 | 7/2015 | Sato et al. |
| 2001/0037761 | A1 | 11/2001 | Yang et al. |
| 2003/0041799 | A1 | 3/2003 | Yang et al. |
| 2006/0131553 | A1 | 6/2006 | Yamanaka et al. |
| 2007/0193501 | A1 | 8/2007 | Ono et al. |
| 2009/0304994 | A1 | 12/2009 | Daub et al. |
| 2012/0285382 | A1 | 11/2012 | Shimizu et al. |
| 2015/0184314 | A1 | 7/2015 | Narahara et al. |
| 2017/0117228 | A1* | 4/2017 | Schauer ................... C23C 16/24 |
| 2018/0197751 | A1 | 7/2018 | Koike et al. |
| 2019/0106809 | A1 | 4/2019 | Haberecht |
| 2021/0087705 | A1 | 3/2021 | Schauer et al. |
| 2022/0020585 | A1 | 1/2022 | Ishibashi et al. |
| 2022/0209064 | A1 | 6/2022 | Sie |
| 2024/0021449 | A1* | 1/2024 | Stettner ............. H01L 21/67259 |

FOREIGN PATENT DOCUMENTS

| | | | |
|---|---|---|---|
| JP | H06-232057 | A | 8/1994 |
| JP | H08-22959 | A | 1/1996 |
| JP | H10-209054 | A | 8/1998 |
| JP | 2001-060580 | A | 3/2001 |
| JP | 2003-532612 | A | 11/2003 |
| JP | 2007-254274 | A | 10/2007 |
| JP | 2011-054622 | A | 3/2011 |
| JP | 2012-238806 | A | 12/2012 |
| JP | 2014-143228 | A | 8/2014 |
| JP | 2017-059658 | A | 3/2017 |
| JP | 2017-092370 | A | 5/2017 |
| JP | 2019-523991 | A | 8/2019 |
| JP | 2020-107730 | A | 7/2020 |
| JP | 2020-529127 | A | 10/2020 |
| JP | 2021082641 | A * | 5/2021 |
| JP | 2022026286 | A * | 2/2022 |
| TW | 201937017 | A | 9/2019 |
| TW | I749972 | B | 12/2021 |
| WO | 2010/035510 | A1 | 4/2010 |

OTHER PUBLICATIONS

Notification of Reasons for Refusal issued in JP Patent Application No. 2023-031821, Oct. 22, 2024, translation.

Office Action issued in TW Patent Application No. 112106192, 27 Jun. 27, 2024, translation.

Office Action issued in TW Patent Application No. 112106192, Dec. 4, 2024, translation.

Office Action issued in KR Patent Application No. 10-2023-0045312, Dec. 10, 2024, translation.

Notice of Allowance issued in KR Patent Application No. 10-2023-0045312, Sep. 30, 2025, translation.

Office Action issued in DE Patent Application No. 10 2023 203 061.6, Jun. 26, 2025, translation.

Office Action issued in TW Patent Application N. 114119592, Dec. 5, 2025, translation.

\* cited by examiner

MEASUREMENT POINTS

MEASUREMENT POINTS

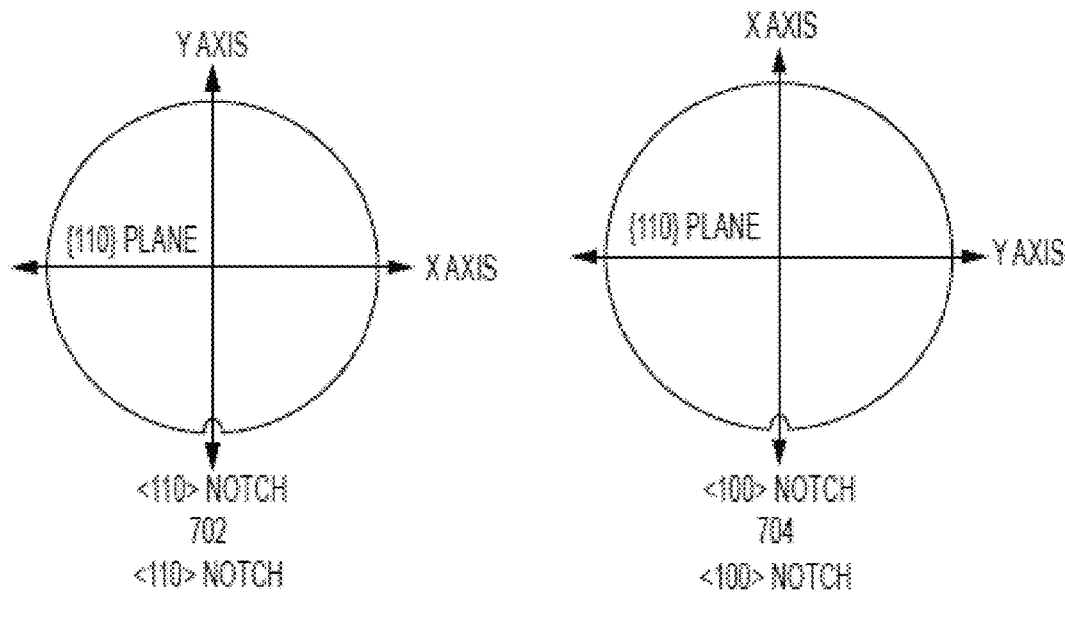
FIG. 7A      FIG. 7B
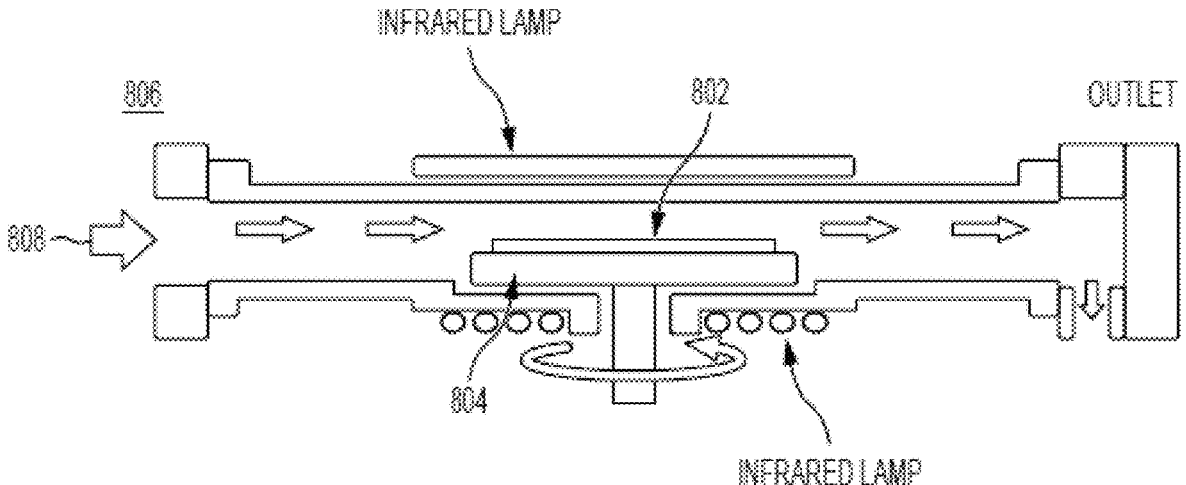
FIG. 8

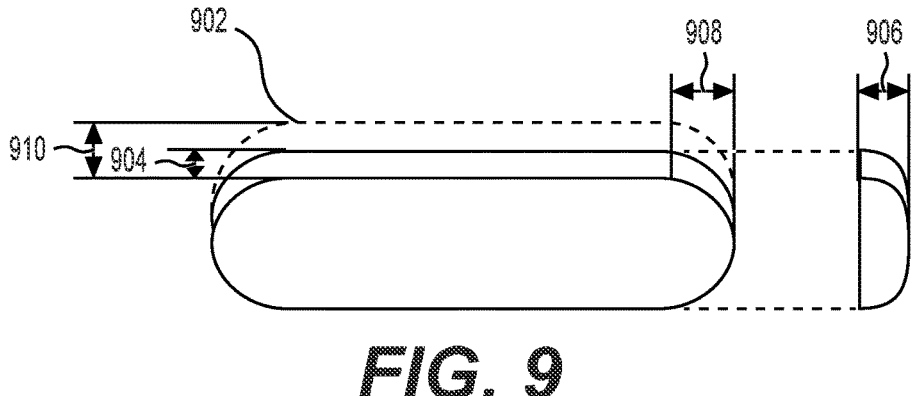
*FIG. 9*
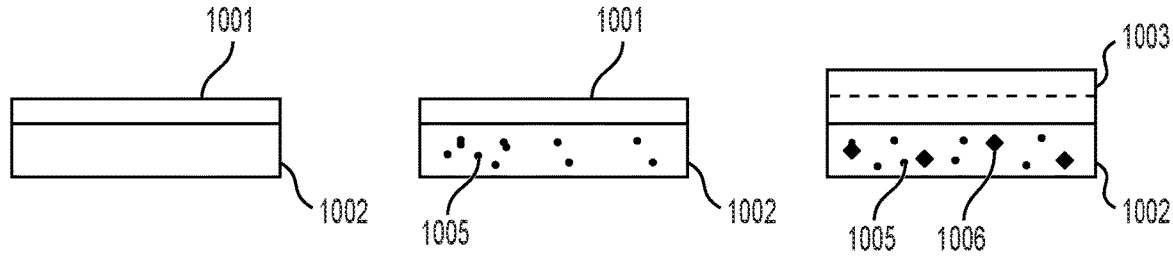
*FIG. 10A*      *FIG. 10B*      *FIG. 10C*
*(RELATED ART)*

FLAT EPITAXIAL WAFER HAVING MINIMAL THICKNESS VARIATION

CROSS-REFERENCE TO RELATED APPLICATION

This application claims priority to U.S. Provisional Application No. 63/329,199 entitled EPITAXIAL WAFER AND METHOD FOR MAKING SAME, filed Apr. 8, 2022, which is expressly incorporated by reference herein in its entirety.

BACKGROUND OF THE DISCLOSURE

1. Field of the Disclosure

The present disclosure relates to an epitaxial wafer, and a method of manufacturing an epitaxial wafer.

2. Description of Related Art

A fin field effect transistor (finFET) provides 3-dimensional fins (102), each as a channel that is contacted by the gate (104) on three sides. This is shown in FIG. 1(a). This structure helps reduce leakage current over the conventional metal oxide semiconductor field effect transistors (MOSFETs). But, as the design rules dictate higher densities in a semiconductor device, channel lengths in a transistor are shortened, and even the 3-sided contact with the gate offered by the vertical fin channels of a finFET will likely become prone to leakage currents. In a gate-all-around (GAA) FET as shown in FIG. 1(b), the channels (106) are stacked on top of the surface of a silicon wafer (108) and the gate (110) surrounds all four sides of a channel Since such a channel is stacked above the silicon wafer, the surface (112) of the silicon wafer is required to have much improved flatness and uniformity.

SUMMARY OF THE DISCLOSURE

This invention relates to certain epitaxial wafers that are useful for devices using gate-all-around field-effect transistors (GAA FETs). A very thin epitaxial layer of the present invention provides a flat and smooth surface with very small or no thickness variations.

A first aspect of the present invention includes a silicon substrate having a top surface and a thin epitaxial layer formed on the top surface that is substantially unaffected by the surface irregularities caused by the process-induced defects (PIDs) of the silicon substrate below.

A second aspect of the present invention relates to improving the edge site flatness (i.e., Maximum ESFQR) of an epitaxial wafer and thereby improving the overall flatness of the surface of the epitaxial wafer.

A third aspect of the present invention includes an improved Maximum ESFQR having an edge exclusion region of 1 mm to 2 mm.

A fourth aspect of the present invention includes a chamfer width being in a range of 150 μm to 450 μm.

A fifth aspect of the present invention includes the silicon substrate being free of dislocation clusters and COP defects.

A sixth aspect of the present invention includes the silicon substrate being free of COP defects that have a maximum cross-sectional width of 110 nm or greater.

A seventh aspect of the present invention includes the silicon substrate containing nitrogen.

An eighth aspect of the present invention includes the silicon substrate cut from {110} plane crystal at a tilt angle of 0.1 to 1.2 degrees.

A ninth aspect of the present invention includes a haze level of the epitaxial layer being 1.20 ppm or less.

A tenth aspect of the present invention includes an epitaxial layer having both a thickness variation and thickness uniformity of 1.0% or less.

An eleventh aspect of the present invention includes a method of making an epitaxial wafer including placing a silicon substrate on a susceptor in an epitaxial reactor; rotating the susceptor at a rotation rate (D); and applying a source gas in the epitaxial reactor to grow an epitaxial layer of a desired thickness (B) at a growth rate (A) on the silicon substrate; wherein the source gas is applied for a growth time (C) that satisfies C=B/A and the rotation rate (D) is selected from a range of 22 to 70 rpm that allows the susceptor to rotate to an integer number of turns (E) based on a relationship D=E/C.

BRIEF DESCRIPTION OF THE DRAWINGS

FIGS. 7(a) and 7(b) illustrate a reference notch in either <110> crystal orientation (i.e., along the Y-axis) or <100> crystal orientation (i.e., along the X-axis), respectively;

FIG. 8 illustrates a method of production of an epitaxial wafer according to an embodiment of the present invention;

FIG. 9 illustrates shorter versus longer chamfer width of a wafer;

FIGS. 10(a) and 10(b) illustrate preferred epitaxial wafers having thin epitaxial layers according to embodiments of the present invention; and FIG. 10(c) illustrates a conventional epitaxial wafer having a thicker epitaxial layer.

DETAILED DESCRIPTION OF THE DISCLOSURE

Figures 1A, 1B, 2A:
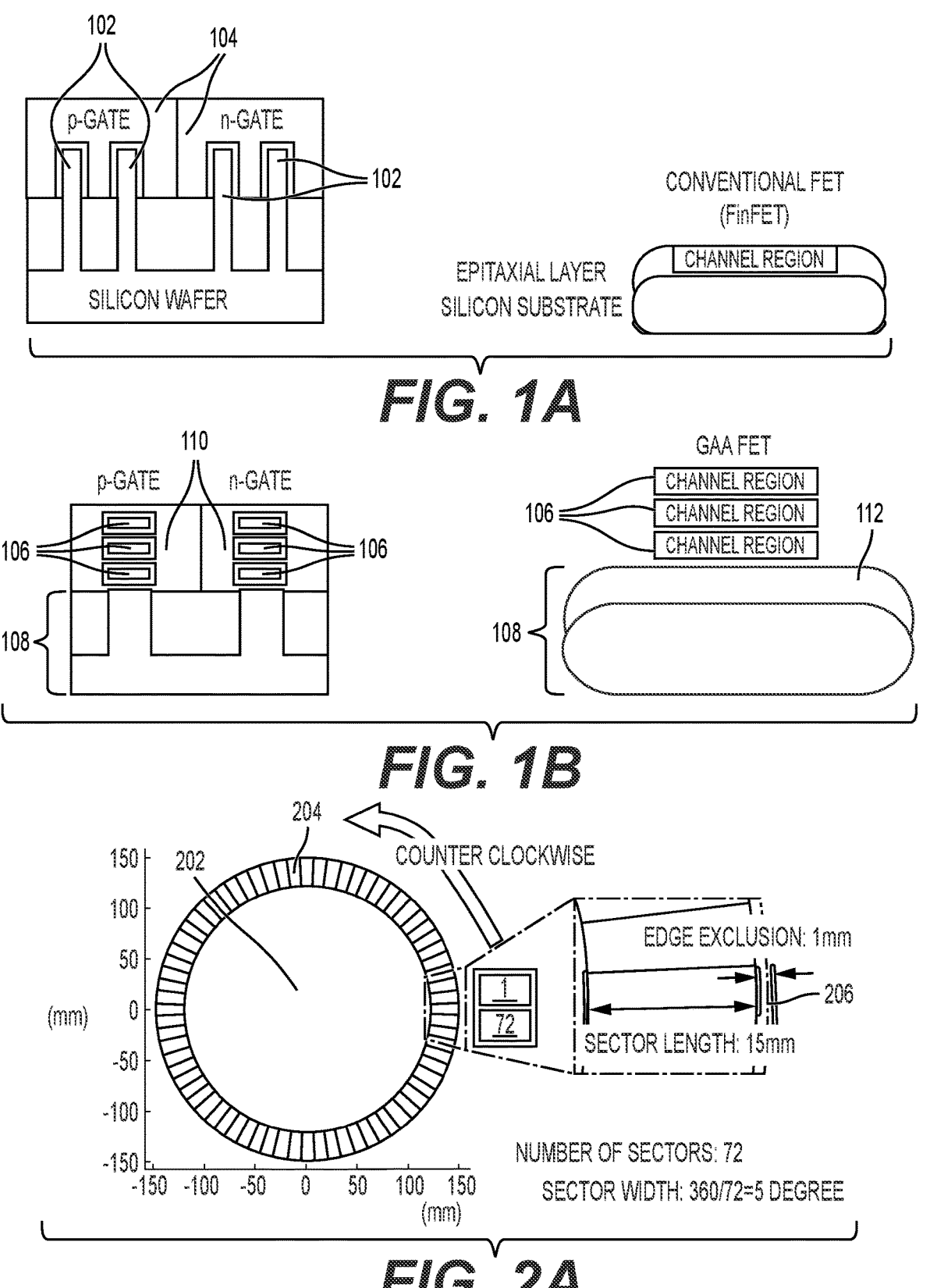
FIG. 1(a) is a general rendering of a fin FET device.
FIG. 1(b) is a general rendering of a GAA FET device.
FIGS. 2(a) and 2(b) illustrate a method for determining ESFQR of a wafer.

The particulars shown herein are by way of example and for purposes of illustrative discussion of example features of the present disclosure only and are presented to illustrate what is believed to be the most useful and readily understood description of the principles and conceptual aspects of the example features. In this regard, no attempt is made to show structural details of the example features in more detail than is necessary for the fundamental understanding thereof, the description taken with the drawings making apparent to those skilled in the art how the forms of the example features may be embodied in practice.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween, such as increments of 0.1%. Moreover, when the words "generally" and "substantially" are used in connection with geometric shapes, it is intended that precision of the geometric shape is not required but that latitude for the shape is within the scope of the disclosure.

In the drawing figures, the dimensions of layers and regions may be exaggerated for clarity of illustration. Like reference numerals refer to like elements throughout. The same reference numbers indicate the same components throughout the specification. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Exemplary features are described herein with reference to cross-sectional illustrations that are schematic illustrations of idealized features (and intermediate structures) of example features. As such, variations from the shapes of the illustrations as a result, for example, of manufacturing techniques and/or tolerances, are to be expected. Thus, example features should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a material and are not intended to limit the scope of example features.

The present invention relates to certain epitaxial wafers that are useful for devices using gate-all-around field-effect transistors (GAA FETs). A very thin epitaxial layer of the present invention provides a flat and smooth surface with very small or no thickness variations. The thin epitaxial layer formed on the top surface of a silicon substrate that is substantially unaffected by the surface irregularities caused by the process-induced-defects (PIDs) on the top surface of the silicon substrate below.

The preferred thickness of the epitaxial layer of the present invention is in the range of 0.3 μm to 1.0 μm. Preferably, the epitaxial wafer of the present invention has a thickness in the epitaxial layer of about 0.5 μm.

One of the critical aspects of the present invention involves ESFQR (Edge Site Frontside least sQuares Range) which relates to the overall flatness of the wafer. ESFQR is an analytical characterization near the edge of a wafer, which affects the flatness of the entire wafer. Here, SFQR (Site Frontside least sQuares Range) is a measurement of flatness along the entire wafer surface in small segments. ESFQR is an index representing the flatness found by measuring the SFQR inside a fan-shaped region formed in the peripheral portion of a wafer. A smaller ESFQR indicates higher flatness. ESFQR and SFQR are indices for measuring wafer flatness according to the SEMI Standards (M1, M67, or M1530). ESFQR may be determined using a flatness measurement system such as WAFERSIGHT 2 manufactured by KLA-Tencor Corporation.

Figure 2B:
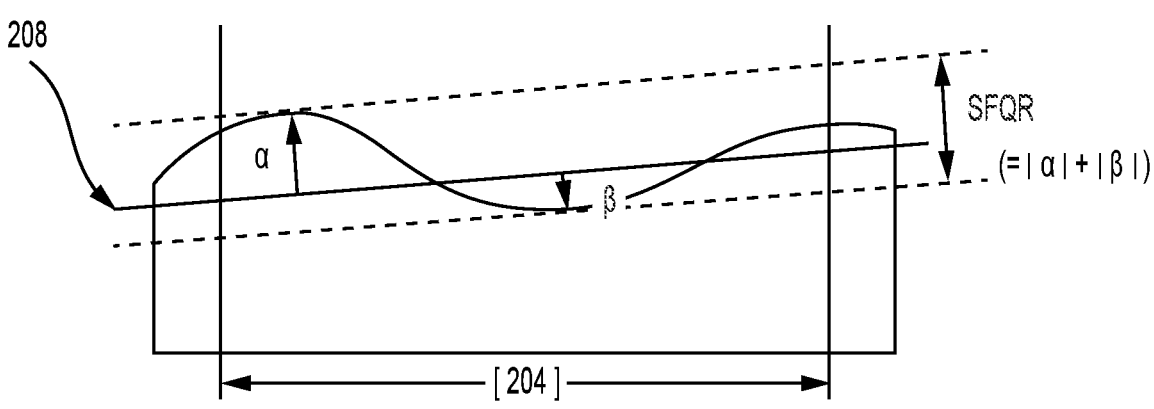

ESFQR of a wafer may be determined as shown in FIGS. 2(a) and 2(b). In FIG. 2(a), a 300 mm wafer (202) is divided into 72 sectors, or sites (204), each site having an arc of 5 degrees, and each site having an edge exclusion region (206) of 1 mm and a site length of 15 mm. The edge exclusion region is arbitrarily selected here, and may be 1 mm to 2 mm. In this case, the "Maximum ESFQR" means the largest ESFQR value determined among the 72 sites.

As illustrated in FIG. 2(b), a maximum value $\alpha$ of a site (204) is determined as a maximum height above a least squares site reference plane (208), and a minimum value $\beta$ is determined as a minimum value below a least squares site reference plane (208). Mathematically, ESFQR is an absolute value of the maximum range from least squares site reference plane (208) in an edge site, or $ESFQR=|\alpha|+|\beta|$.

Preferably, the Maximum ESFQR of embodiments of the present invention is not greater than 11.3 nm at an edge exclusion region (206) of about 1 mm from the edge of the wafer.

Figure 3:
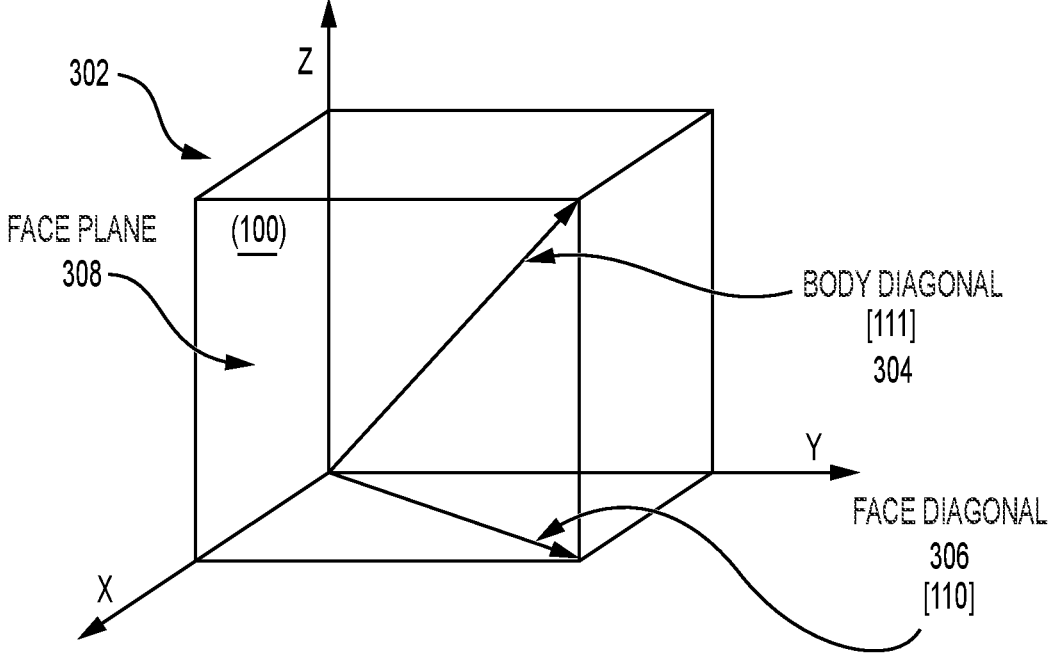
FIG. 3 illustrates a cubic crystal defined by its Miller Indices.

As a review of basic crystal plane and crystal direction nomenclature, Miller Indices are a 3-dimensional coordinate system for crystals, based on the unit cell. Such coordinate system can indicate directions or planes, and is often written as (hkl). As illustrated in FIG. 3, some examples of Miller Indices on a cubic crystal (302) include [111], the body diagonal (304); [110], the face diagonal (306); and (100), the face plane (308). The brackets surrounding the hkl have specific designations, wherein [hkl] represents a direction; <hkl> represents a family of directions; (hkl) represents a plane; and {hkl} represents a family of planes. A silicon crystal, having a cubic silicon lattice, may be defined in accordance with its equivalent family of planes determined by its seed crystal, i.e., an {hkl} plane silicon crystal. In this regard, crystals may be grown to form either the {100} or {110} plane by choosing different seed crystals at the outset of pulling the crystal from the molten silicon. The determination of {110} and {100} planes and the crystal orientation of <110> and <100> and the related wafer cutting techniques are known in the art as shown by example in U.S. Pat. Nos. 8,152,919 and 5,904,136.

Tables 1 and 2 show how the thickness of an epitaxial layer effects ESFQR. Table 1 compiles the measurements from epitaxial wafers using {100} plane silicon substrates and the thickness of the epitaxial layer ranging from 0.3 μm to 2.0 μm. Table 2 compiles the measurements from epitaxial wafers using {110} plane silicon substrates and the thickness of the epitaxial layer again ranging from 0.3 μm to 2.0 μm.

TABLE 1

| thickness of epitaxial layer (μm) | Maximum ESFQR (nm) |
|---|---|
| 0.3 | 10.0 |
| 0.5 | 10.0 |
| 1.0 | 11.0 |
| 2.0 | 18.0 |

TABLE 2

| thickness of epitaxial layer (µm) | Maximum ESFQR (nm) |
|---|---|
| 0.3 | 10.7 |
| 0.5 | 10.4 |
| 1.0 | 11.1 |
| 2.0 | 15.1 |

Tables 1 and 2 show that the preferred range of thicknesses for the epitaxial layer is from 0.3 µm to 1.0 µm. As shown such a range maintains Maximum ESFQR at 11.1 nm or less for both {100} and {110} substrates.

Another aspect of the present invention relates to improving the thickness variation of the epitaxial layer. Yet another aspect of the present invention relates to the thickness uniformity of the epitaxial layer. A measurement principle for thickness variation of an epitaxial layer is shown in FIG. 4.

Figure 4:
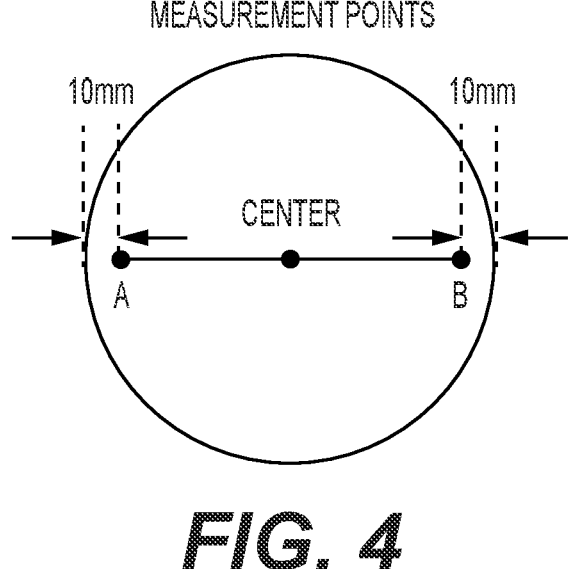
FIG. 4 illustrates a measurement principle for calculating thickness variation of an epitaxial layer.

As shown in FIG. 4, the thickness variation of an epitaxial layer [%] may be calculated as follows: $|(A-B)|/(A+B)\times100$, where A and B are any two measured thicknesses of the epitaxial layer inside 10 mm from the edge of the wafer. As shown, however, A and B are symmetrical with respect to the center.

The thickness variation of the epitaxial layer of the present invention is preferably 1.0% or less.

Figure 5:
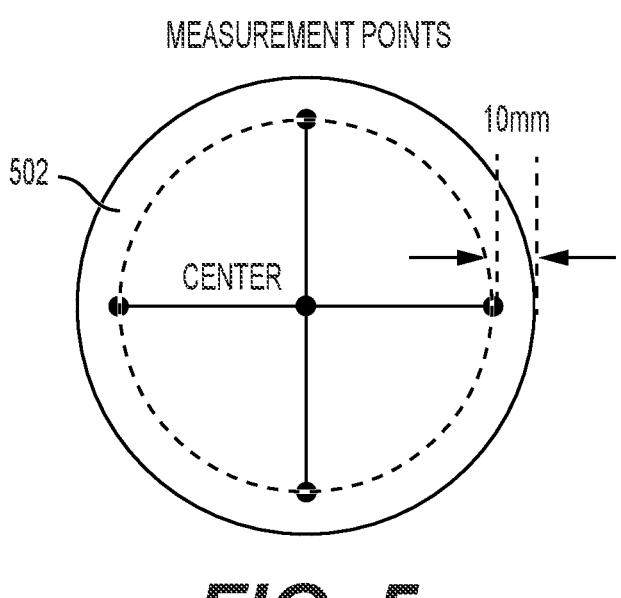
FIG. 5 illustrates a measurement principle for calculating thickness uniformity of an epitaxial layer.

Similarly, as shown in FIG. 5, the thickness uniformity of the epitaxial layer [%] of the present invention is calculable as follows: $(Max-Min)/(Max+Min)\times100$, where "Max" and "Min" are the maximum and minimum thicknesses of the epitaxial layer (502), inside 10 mm from the edge of the wafer, among any 4 symmetrical points (i.e., 2 pairs of symmetrical points) and the center of the epitaxial layer. The thickness uniformity of the epitaxial layer of the present invention is preferably 1.0% or less.

The thickness variation and thickness uniformity of the epitaxial layer of the present invention may be achieved by certain production methods. In particular, the preferred silicon substrate, on the surface of which the epitaxial layer is grown, according to the present invention is a silicon substrate cut from the {110} plane at a tilt angle of ±0.1 to 1.2 degrees. Preferably, such a tilt angle may be achieved by rotating the {110} plane, in the X-Y plane, with respect to the Y-axis (tilt direction). This arrangement is shown in FIG. 6(a), and further described as follows.

Figure 6A:
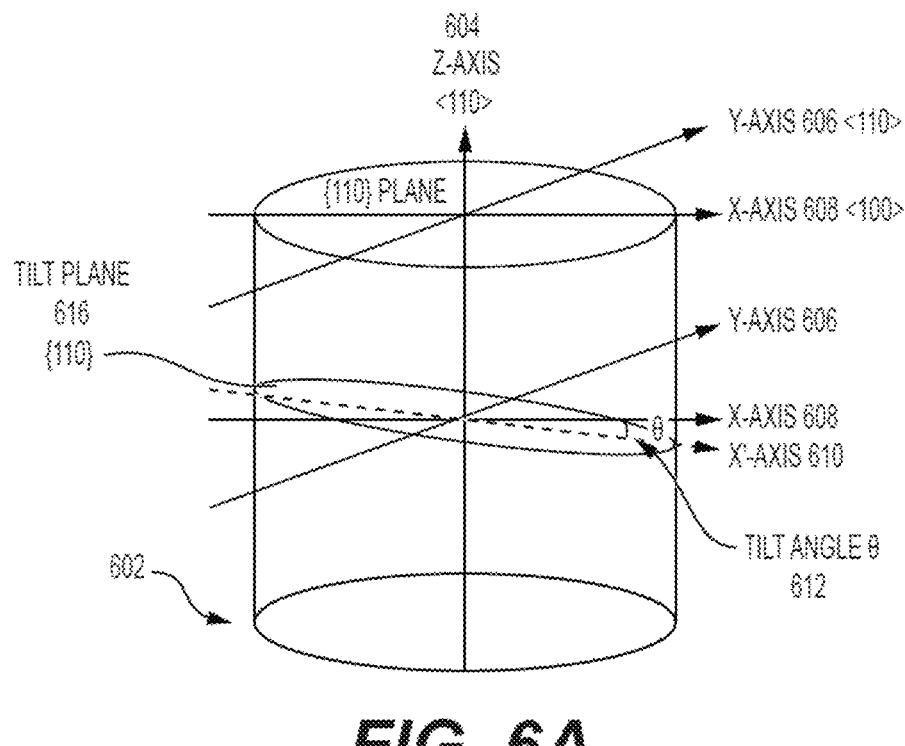
FIG. 6(a) illustrates a method for production of a silicon substrate having a tilt angle according to an embodiment of the present invention.

FIG. 6(a) shows a vertically pulled monocrystalline silicon ingot (602) along the Z-axis (604). As can be appreciated, each axis shown in FIG. 6(a) represents the following orientations in relation to the crystal structure. The Z-axis (604) is a <110> orientation that coincides with the pulling direction of the crystal. The Y-axis (606) is another <110> orientation in a plane perpendicular (orthogonal) to the Z-axis. The X-axis (608) is an <100> orientation in a plane orthogonal to the Z-axis.

If there is a notch at the <110> orientation in the silicon substrate, the Y-axis is a line passing from the notch to the center of the silicon substrate as shown in FIG. 7(a). If there is a notch at the <100> orientation in the silicon substrate, the Y-axis is a line orthogonal to another line passing from the notch to the center of the silicon substrate as shown in FIG. 7(b).

The X'-axis (610) is a rotated X-axis around the Y-axis.

The tilt angle θ (612) is an angle between the X-axis and the X'-axis.

Both positive and negative tilt angles represent the same silicon substrate.

The {110} silicon substrate of the present invention is cut at an angle in a certain direction, designated herein as "tilt angle" (612) and "tilt direction" (614), respectively. As illustrated in FIG. 6(a), consider for example a {110} silicon substrate from a crystal set in a 3-dimensional axis (X, Y, Z axes), if the direction of the crystal growth is set along the Z-axis (in the <110> orientation), then the silicon substrate cut from the crystal is in the X-Y plane, which is orthogonal to the Z-axis. Here, the X-axis is aligned in the <100> orientation and Y-axis in <110> orientation. In such a configuration, the tilt angle and tilt direction mean rotating such X-Y plane with respect to the Y-axis (in either direction) by a small angular displacement. Such rotated plane is designated herein as the "tilt plane" (616) and, therefore, the silicon substrate cut with a tilt angle is in the tilt plane. Preferably the tilt angle is in a range of 0.1 to 1.2 degrees.

Figure 6B:
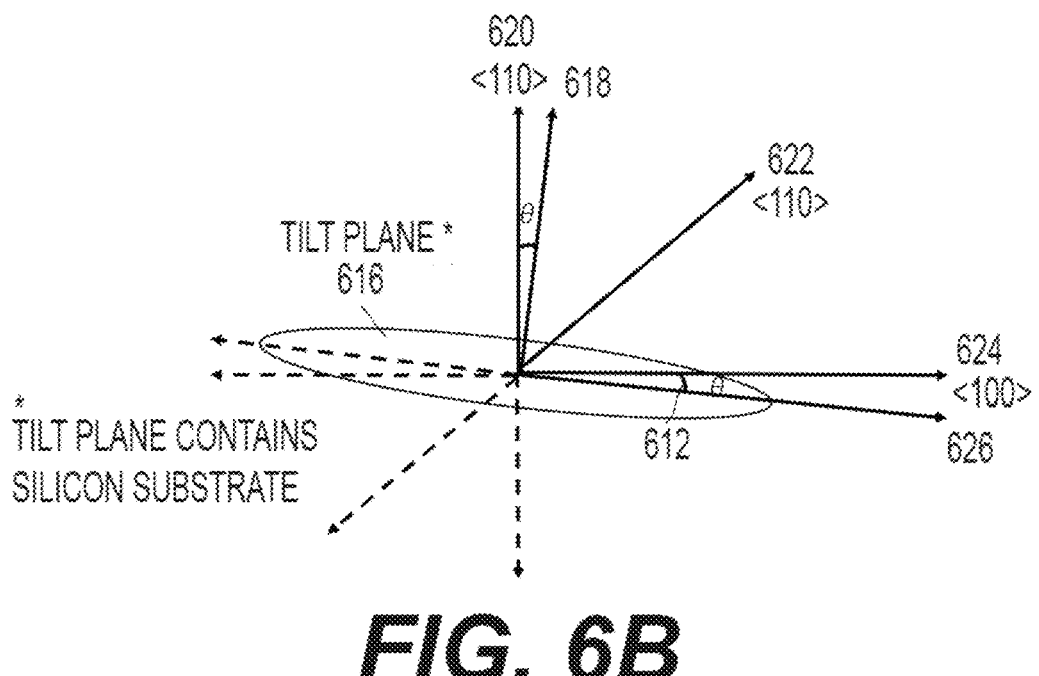
FIG. 6(b) is an isolated depiction of the silicon substrate cut from the tilt plane shown in FIG. 6(a)

FIG. 6(b) is an isolated depiction of the silicon substrate which is cut from the tilt plane (616) as shown in FIG. 6(a). Here, the normal vector (618) is orthogonal to such tilt plane (616) (i.e., orthogonal to the surface of the silicon substrate) and the tilt angle θ (612) is an angle between the normal vector (618) and the first vector in <110> orientation, the first vector (620) being in the direction of the crystal pull. The first vector (620) is orthogonal to the second vector (622), also in <110> orientation, which extends in the radial direction of the silicon substrate in the tilt plane (616). Further, the third vector (624) in <100> orientation is orthogonal to the second vector (622). Also, as shown in FIG. 6(b), the fourth vector (626) is orthogonal to the normal vector (618) and the angle between the third vector (624) and the fourth vector (626) again constitutes the tilt angle θ (612). FIG. 6(b) further shows that the second (622) and fourth (626) vectors lie in the tilt plane (616). Note that, given a wafer (silicon substrate) of the {110} plane, one can determine these vectors including the first vector and the normal vector (618) by an X-ray diffraction and, therefore, the tilt angle θ (612).

It should be noted that growing a crystal in the {110} plane is not an exact science. A small deviation in the crystal alignment, for example, may be needed to prevent dislocation defects in the beginning stages of the crystal growth. Any such small deviations would be within the tolerance if the resulting silicon substrate exhibits the electrical properties that are expected in the {110} plane. And those skilled in the art would understand that a crystal grown with any such small deviation is nonetheless a {110} crystal if the resulting silicon substrates exhibit more or less the expected electrical properties of the {110} plane.

Silicon substrates of {110} plane have shown improved hole mobility compared to substrates of {100} plane, but at the expense of increased haze level and rougher surface. Therefore, a {110} wafer, with enhanced hole mobility, should particularly be useful in the application of said GAA FETs. However, the use of a conventional {110} substrate alone would not be acceptable in terms of surface roughness and high haze level. In another aspect of the present invention, a silicon substrate is cut from a crystal of {110} plane a tilt angle of ±0.1 to 1.2 degrees, wherein such a tilt angle is achieved by rotating the {110} plane, in the X-Y plane, with respect to the Y-axis.

Such a tilt angle of the present invention helps to maintain the desired haze level and desired level of surface roughness which had been difficult to obtain from a conventional {110} silicon substrate. Thus, as in the preferred embodiment of this invention, providing a silicon substrate from the {110} plane at a tilt angle affords greater carrier mobility without compromising surface roughness or the haze level. Preferably, the haze level of the epitaxial layer of the present invention is 1.2 ppm or less. Haze level can be measured using the DWO mode of a SURFSCAN SP2 made by KLA-Tencor.

FIGS. 7(*a*) and 7(*b*) illustrate ways of forming a reference notch on a {110} wafer. FIG. 7(*a*) shows a notch (702) at an end of Y-axis, or in <110> crystal orientation. FIG. 7(*b*) shows a notch (704) at an end of X-axis, or in <100> crystal orientation.

Table 3 shows haze level measurements (ppm) for various epitaxial wafers of different thicknesses of epitaxial layer and tilt angles, each such wafer having a {110} silicon substrate.

TABLE 3

| tilt angle | thickness of epitaxial layer (μm) | | | |
|---|---|---|---|---|
| (degrees) | 0.3 μm | 0.5 μm | 1.0 μm | 2.0 μm |
| | | haze level (ppm) | | |
| 0 | 1.88 | 1.57 | 2.25 | 2.63 |
| 0.1 | 0.88 | 0.85 | 0.88 | 0.87 |
| 0.4 | 0.65 | 0.62 | 0.68 | 0.65 |
| 0.7 | 0.66 | 0.63 | 0.64 | 0.72 |
| 1 | 0.64 | 0.59 | 0.67 | 0.69 |
| 1.2 | 0.59 | 0.61 | 0.65 | 0.65 |

Table 3 illustrates that a tilt angle between 0.1 to 1.2 degrees results in a low haze level of not more than 0.88 ppm for the thin range of thicknesses of epitaxial layer.

A method of production of an epitaxial wafer according to one embodiment of the present invention is as follows. As shown in FIG. 8, a silicon substrate (802) is disposed on a susceptor (804) and rotated in a reaction chamber (not shown). The gas inlet (806) receives a silicon source gas (808), such as $SiHCl_3$, and a carrier gas, such as $H_2$. A dopant gas, such as $B_2H_6$, may also be introduced through the gas inlet (806). The silicon substrate (802) is heated from above and below, and is exposed to a silicon source gas for growth of the epitaxial layer. A dopant is included with the silicon source gas (808) and may be carried by a carrier gas. The susceptor (804) rotates while the epitaxial layer is grown on the silicon substrate (802).

Flow rate of carrier gas is generally 30-100 standard liters per minute (SLM). Flow rate of silicon source gas is generally 3-20 SLM. Growth temperature is typically fixed between 1100° C.-1175° C. Growth time of the epitaxial layer is in the range of 0.1 to 1.0 minutes. Rotation rate of the susceptor is preferably 22-70 revolutions per minute (RPM). It has been found that if rotation rate of the susceptor is slower than the above preferred lower limit (22 RPM), the thickness of the epitaxial layer at or about the edge tends to become too thick. On the other hand, if the rotation rate of the susceptor is faster than the above preferred upper limit (70 RPM), the thickness of the epitaxial layer in the center portion of the wafer tends to become too thick. Therefore, it is important to set the susceptor rotation rate between 22 to 70 RPM to achieve the overall thickness uniformity of the epitaxial layer at 1.0% or less.

Table 4 shows the results of how the susceptor rotation rate affects the thickness uniformity of an epitaxial layer. In this example, a silicon substrate cut from {100} plane was placed in the reaction chamber and rotated to grow an epitaxial layer of 0.5 μm. The susceptor was rotated incrementally between 22 to 70 RPM.

TABLE 4

| rotation rate (rpm) | thickness uniformity of epitaxial layer (%) |
|---|---|
| 20 | 1.3 |
| 22 | 0.8 |
| 25 | 0.7 |
| 30 | 0.7 |
| 35 | 0.6 |
| 40 | 0.7 |
| 45 | 0.6 |
| 50 | 0.5 |
| 55 | 0.7 |
| 60 | 0.7 |
| 65 | 0.7 |
| 70 | 0.9 |
| 72 | 1.2 |

Table 5 again shows the results of how the susceptor rotation rate affects the thickness uniformity of an epitaxial layer. In this example, a silicon substrate cut from {110} plane with a tilt angle of 1.0 degree was placed in the reaction chamber and rotated to grow an epitaxial layer of 0.5 μm. The susceptor was rotated incrementally between 22 to 70 RPM.

TABLE 5

| rotation rate (rpm) | thickness uniformity of epitaxial layer (%) |
|---|---|
| 20 | 1.2 |
| 22 | 0.8 |
| 25 | 0.8 |
| 30 | 0.6 |
| 35 | 0.5 |
| 40 | 0.6 |
| 45 | 0.6 |
| 50 | 0.7 |
| 55 | 0.6 |
| 60 | 0.7 |
| 65 | 0.7 |
| 70 | 0.8 |
| 72 | 1.4 |

As shown in Tables 4 and 5, the thickness uniformity of the epitaxial layer may be maintained at 1.0% or less by setting the susceptor rotation rate in the range of 22 to 70 RPM for epitaxial wafers of both {100} and {110} silicon substrates.

Conventionally, the growth of an epitaxial layer for an epitaxial wafer is controlled by the growth rate, which is affected by the gas flow rate, and reaction time to achieve a certain desired thickness. In the present invention, the number of turns of the susceptor is an integer value to ensure the achievement of desired thickness variation in addition to the desired thickness of the epitaxial layer. In one embodiment, the integer number of turns may be determined with the following assumptions at the desired level: epitaxial thickness (B)=0.5 μm; susceptor rate (D)=25 rpm; epitaxial growth rate (A)=2 μm/min; growth time (C)=to be determined; and integer number of turns (E)=to be determined. It follows that C=B/A or 0.25 min; and E may be computed as D=E/C or E=D×C or 6.25, it follows that E is the closest integer number to 6.25, or 6 turns.

Table 6 shows the effects of rotating the susceptor an integer number of turns compared to a non-integer number of turns on the thickness variation of the epitaxial layer. For these examples an epitaxial wafer having a silicon substrate cut from {100} plane and an epitaxial layer having a thickness of 0.5 μm was used. Temperature and the gas flow rate were set to achieve an epitaxial growth rate of 2.0 μm/minute. In each of Example 1 and 2 the number of revolutions were adjusted to an integer value as described above. The thickness variation of the epitaxial layer was measured and recorded. In the Comparative Example, the conditions were identical except the number of revolutions for the susceptor was a non-integer value.

TABLE 6

|  | Comparative Example | Example 1 | Example_2 |
| --- | --- | --- | --- |
| number of turns (turns) | 12.5 | 10 | 17 |
| rotation rate (rpm) | 50 | 40 | 68 |
| thickness variation of epitaxial layer (%) | 1.4 | 0.6 | 0.7 |

Table 7 again shows the effects of rotating the susceptor an integer number of turns compared to a non-integer number of turns on the thickness variation of the epitaxial layer. For these examples an epitaxial wafer having a silicon substrate cut from {110} plane and an epitaxial layer having a thickness of 0.5 μm was used. Temperature and the gas flow rate were set to achieve an epitaxial growth rate of 2.0 μm/minute. In each of Example 1 and 2 the number of revolutions were adjusted to an integer value as described above. The thickness variation of the epitaxial layer was measured and recorded. In the Comparative Example, the conditions were identical except the number of revolutions for the susceptor was a non-integer value.

TABLE 7

|  | Comparative Example 1 | Example 1 | Example_2 |
| --- | --- | --- | --- |
| number of turns (turns) | 12.5 | 10 | 17 |
| rotation rate (rpm) | 50 | 40 | 68 |
| thickness variation of epitaxial layer (%) | 1.5 | 0.6 | 0.6 |

The results in Tables 6 and 7 demonstrate that rotating the susceptor an integer number of turns is critical to keeping the thickness variation of the epitaxial layer at a sufficiently low value. They demonstrate also that both {100} and {110} epitaxial wafers benefit from implementing the integer number of turns of the susceptor during the epitaxial growth.

Table 8 further demonstrates how rotating the susceptor an integer number of turns affects the thickness variation for various thicknesses of epitaxial layer. Table 8 compiles the thickness variation data for {100} epitaxial wafers having 3 different thicknesses of epitaxial layer of 0.3, 0.5 and 1.0 μm.

TABLE 8

| | thickness variation of epitaxial layer (%) | |
| --- | --- | --- |
| thickness of epitaxial layer (μm) | Comparative Example (non-integer number) | Invention Example (integer number) |
| 0.3 | 1.8 | 0.8 |
| 0.5 | 1.5 | 0.7 |
| 1.0 | 1.1 | 0.8 |

Table 9 again demonstrates how rotating the susceptor an integer number of turns affects the thickness variation for various thicknesses of epitaxial layer. Table 9 compiles the thickness variation data for {110} epitaxial wafers having 3 different thicknesses of epitaxial layer of 0.3, 0.5 and 1.0 μm.

TABLE 9

| | thickness variation of epitaxial layer (%) | |
| --- | --- | --- |
| thickness of epitaxial layer (μm) | Comparative Example (non-integer number) | Invention Example (integer number) |
| 0.3 | 1.9 | 0.9 |
| 0.5 | 1.7 | 0.8 |
| 1.0 | 1.2 | 0.8 |

The results in Tables 8 and 9 demonstrate that, regardless of thicknesses of epitaxial layer, rotating susceptor an integer number of turns keeps the thickness variation at a significantly low value for various wafer types and thicknesses of epitaxial layer.

Another aspect of the epitaxial wafer of the present invention includes a preferred chamfer width on the top surface of the silicon substrate being in a range of 150 μm to 450 μm. Conventionally, the chamfer width of an epitaxial wafer tends to be wider than the preferred chamfer width of the present invention which results in a smaller active area overall. As shown in FIG. 9, the preferred epitaxial wafer (902) of the present invention includes a thinner thickness of the epitaxial layer (904) and a shorter chamfer width (906) in comparison to a conventional chamfer width (908) of a conventional epitaxial wafer.

FIG. 9 depicts a conventional thickness of the epitaxial layer (910) in the dotted portion. Typically, the conventional epitaxial layer is about 2 microns in thickness. By comparison, FIG. 9 further shows the preferred thickness of the epitaxial layer of the present invention (904) (below the dotted portion) which in the range of 0.3 to 1.0 micron.

A shorter chamfer width of the present invention further improves ESFQR.

Table 10 demonstrates the effect of chamfer widths on ESFQR. In this demonstration {100} epitaxial wafers having thicknesses of epitaxial layer from 0.3 μm to 2.0 μm were used, each being tested for chamfer widths from 150 μm to 550 μm. Maximum ESFQR was measured at a different chamfer width for each wafer.

TABLE 10

| thickness of epitaxial layer (μm) | chamfer width (μm) | | | | |
| --- | --- | --- | --- | --- | --- |
| | 150 μm | 250 μm | 350 μm | 450 μm | 550 μm |
| | | Maximum ESFQR (nm) | | | |
| 0.3 | 9.7 | 9.6 | 9.7 | 10.0 | 13.5 |
| 0.5 | 9.5 | 9.7 | 10.0 | 10.0 | 13.6 |
| 1.0 | 10.0 | 10.2 | 10.7 | 11.0 | 15.4 |
| 2.0 | 11.1 | 12.5 | 16.3 | 18.0 | 24.7 |

Table 11 again demonstrates the effect of chamfer widths on ESFQR. In this demonstration {110} epitaxial wafers having thicknesses of epitaxial layer from 0.3 μm to 2.0 μm were used, each being tested for chamfer widths from 150 μm to 550 μm. Maximum ESFQR was measured at different chamfer width for each wafer.

TABLE 11

| thickness of epitaxial layer (μm) | chamfer width (μm) | | | | |
|---|---|---|---|---|---|
| | 150 μm | 250 μm | 350 μm | 450 μm | 550 μm |
| | Maximum ESFQR (nm) | | | | |
| 0.3 | 9.1 | 9.1 | 9.5 | 10.7 | 13.3 |
| 0.5 | 9.2 | 9.1 | 9.8 | 10.4 | 13.6 |
| 1.0 | 9.9 | 9.9 | 10.4 | 11.1 | 15.6 |
| 2.0 | 11.5 | 12.1 | 13.9 | 15.1 | 20.3 |

The results in Tables 10 and 11 demonstrate that the chamfer width in the range of 150 μm to 450 μm provides a Maximum ESFQR at a desired less than 11.1 nm. More importantly, such range of chamfer widths provides an acceptable Maximum ESFQR for wafers of varying thicknesses of epitaxial layer (i.e., in a range of 0.3 to 1.0 μm).

As previously noted, a very thin epitaxial layer of the present invention provides a flat and smooth surface with small or no thickness variations, and such thin epitaxial layer formed on the top surface of a silicon substrate is substantially unaffected by the surface irregularities caused by the process-induced-defects (PIDs) on the top surface of the silicon substrate below. Nevertheless, it is preferred that the present invention includes a silicon substrate being substantially free of COP defects that have a maximum cross-sectional width of 110 nm or greater. It is particular preferred that the present invention includes a silicon substrate being substantially free of dislocation clusters and COP defects.

FIGS. 10(a) and (b) illustrate the preferred epitaxial wafer of the present invention. FIG. 10(a) shows an epitaxial wafer having a relatively thin epitaxial layer (1001) between 0.3 to 1.0 μm with substantially no COP defects in the silicon substrate (1002). FIG. 10(b) shows again a relatively thin epitaxial layer (1001) with COP defects (1005) that are less than 110 nm in the cross-sectional width in the silicon substrate (1002) and substantially without COP defects of bigger size, for example, that are 110 nm or greater in cross-sectional width.

By comparison, FIG. 10(c) shows a conventional epitaxial wafer having an undesirably thicker epitaxial layer (1003) between 2 to 4 μm, and COP defects (1006) that are 110 nm or greater in the cross-sectional width.

The present disclosure is not limited to the above described features, and various variations and modifications may be possible without departing from the scope of the present disclosure.

The invention claimed is:

1. An epitaxial wafer comprising:
a silicon substrate having a top surface; and
an epitaxial layer on said top surface,
the epitaxial layer having a thickness in a range of 0.3 um to 1.0 um, and a thickness variation of 1% or less, the thickness variation being a percent difference between thicknesses at two symmetrical points of the epitaxial layer about 10 mm inward from an outer edge of the epitaxial wafer;
wherein the silicon substrate is cut from a crystal forming a {110} plane which is grown along a Z-axis, the silicon substrate forming a X-Y plane that is orthogonal to the Z-axis, wherein the X-Y plane comprises an X-axis in a <100> orientation and a Y-axis in a <110> orientation, further, wherein, the silicon substrate is cut at a tilt angle by rotating the X-Y plane with respect to the Y-axis.

2. The epitaxial wafer of claim 1, further comprising a Maximum ESFQR of 11.3 nm or less.

3. The epitaxial wafer of claim 2, wherein the Maximum ESFQR is determined with an edge exclusion region of 1 mm to 2 mm.

4. The epitaxial wafer of claim 1, further comprising a chamfer width on the top surface in a range of 150 μm to 450 μm.

5. The epitaxial wafer of claim 1, wherein the silicon substrate is substantially free of dislocation clusters and COP defects.

6. The epitaxial wafer of claim 1, wherein the silicon substrate is substantially free of COP defects that have a maximum cross-sectional width of 110 nm or greater.

7. The epitaxial wafer of claim 6, wherein the silicon substrate contains nitrogen.

8. The epitaxial wafer of claim 1, wherein the tilt angle is in a range of 0.1 to 1.2 degrees.

9. The epitaxial wafer of claim 8, wherein a haze level of the epitaxial layer is 1.20 ppm or less.

10. A method of making an epitaxial wafer comprising:
placing a silicon substrate on a susceptor in an epitaxial reactor;
rotating the susceptor at a rotation rate (D); and
applying a source gas in the epitaxial reactor to grow an epitaxial layer of a desired thickness (B) at a growth rate (A) on the silicon substrate;
wherein the source gas is applied for a growth time (C) that satisfies C=B/A and the rotation rate (D) is selected from a range of 22 to 70 rpm that allows the susceptor to rotate to an exact integer number of turns (E) based on a relationship D=E/C.

11. An epitaxial wafer comprising:
a silicon substrate having a top surface, and
an epitaxial layer on said top surface,
the epitaxial layer having
a thickness in a range of 0.3 μm to 1.0 μm,
a thickness uniformity of 1% or less, the thickness uniformity being a percent difference between thicknesses at two sets of symmetrical points of the epitaxial layer, about 10 mm inward from an outer edge of the epitaxial wafer, and at center, and
a chamfer width on the top surface in a range of 150 μm to 450 μm;
wherein the silicon substrate is cut from a crystal forming a {110} plane which is grown along a Z-axis, the silicon substrate forming a X-Y plane that is orthogonal to the Z-axis, wherein the X-Y plane comprises an X-axis in a <100> orientation and a Y-axis in a <110> orientation, further, wherein, the silicon substrate is cut at a tilt angle by rotating the X-Y plane with respect to the Y-axis.

12. The epitaxial wafer of claim 11, further comprising a Maximum ESFQR of 11.3 nm or less.

13. The epitaxial wafer of claim 12, wherein the Maximum ESFQR is determined with an edge exclusion region of 1 mm to 2 mm.

14. The epitaxial wafer of claim 11, wherein the silicon substrate is substantially free of dislocation clusters and COP defects.

15. The epitaxial wafer of claim 11, wherein the silicon substrate is substantially free of COP defects that have a maximum cross-sectional width of 110 nm or greater.

16. The epitaxial wafer of claim 15, wherein the silicon substrate contains nitrogen.

17. The epitaxial wafer of claim 11, wherein the tilt angle is in a range of 0.1 to 1.2 degrees.

18. The epitaxial wafer of claim 17, wherein a haze level of the epitaxial layer is 1.20 ppm or less.

19. The epitaxial wafer of claim 1, further comprising a chamfer width on the epitaxial layer in a range of 150 μm to 450 μm.

20. The epitaxial wafer of claim 11, further comprising a chamfer width on the epitaxial layer in a range of 150 μm to 450 μm.

21. The epitaxial wafer of claim 1 wherein the silicon substrate has a crystal structure that forms in an X-Y-Z coordinate which comprises an X-axis in a <100> orientation, a Y-axis in a <110> orientation, an X-Y plane in a {110} plane, a Z-axis in a <110> orientation orthogonal to the X-Y plane, and an X-Z plane in a {110} plane orthogonal to the Y-axis, and wherein the silicon substrate is in a plane which includes the Y-axis and an X'-axis which is displaced in the X-Z plane by a tilt angle from the X-axis.

22. The epitaxial wafer of claim 21, wherein the tilt angle is in a range of 0.1 to 1.2 degrees.

23. The epitaxial wafer of claim 22, wherein a haze level of the epitaxial layer is 1.20 ppm or less.

24. The epitaxial wafer of claim 22, wherein a haze level of the epitaxial layer is 0.88 ppm or less.

25. The epitaxial wafer of claim 11 wherein the silicon substrate has a crystal structure that forms in an X-Y-Z coordinate which comprises an X-axis in a <100> orientation, a Y-axis in a <110> orientation, an X-Y plane in a {110} plane, a Z-axis in a <110> orientation orthogonal to the X-Y plane, and an X-Z plane in a {110} plane orthogonal to the Y-axis, and wherein the silicon substrate is in a plane which includes the Y-axis and an X'-axis which is displaced in the X-Z plane by a tilt angle from the X-axis.

26. The epitaxial wafer of claim 25, wherein the tilt angle is in a range of 0.1 to 1.2 degrees.

27. The epitaxial wafer of claim 26, wherein a haze level of the epitaxial layer is 1.20 ppm or less.

28. The epitaxial wafer of claim 26, wherein a haze level of the epitaxial layer is 0.88 ppm or less.

* * * * *